(12) United States Patent
Om'mani

(10) Patent No.: US 7,005,911 B1
(45) Date of Patent: Feb. 28, 2006

(54) POWER MULTIPLEXER AND SWITCH WITH ADJUSTABLE WELL BIAS FOR GATE BREAKDOWN AND WELL PROTECTION

(75) Inventor: Henry A. Om'mani, Castro Valley, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/407,515

(22) Filed: Apr. 4, 2003

(51) Int. Cl.
*H03K 17/62* (2006.01)
*H03K 17/76* (2006.01)
*H03K 17/693* (2006.01)
*H03K 17/735* (2006.01)

(52) U.S. Cl. .................. 327/408; 327/427; 327/434

(58) Field of Classification Search ........ 327/403–404, 327/407–408, 427, 434, 534, 535, 537; 326/113
See application file for complete search history.

(56) References Cited

U.S. PATENT DOCUMENTS

| | | | |
|---|---|---|---|
| 5,650,672 A | | 7/1997 | Curd |
| 5,661,685 A | | 8/1997 | Lee et al. |
| 5,966,043 A | * | 10/1999 | Jinbo ........................ 327/530 |
| 6,008,689 A | * | 12/1999 | Au et al. .................... 327/534 |
| 6,191,615 B1 | * | 2/2001 | Koga ......................... 326/81 |
| 6,348,831 B1 | * | 2/2002 | Baba ......................... 327/537 |
| 6,774,704 B1 | * | 8/2004 | Kushnarenko ............. 327/530 |

FOREIGN PATENT DOCUMENTS

| | | | |
|---|---|---|---|
| JP | 09008642 A | * | 1/1997 |
| JP | 2000077992 A | * | 3/2000 |
| JP | 2000183710 A | * | 6/2000 |

OTHER PUBLICATIONS

Jongshin Shin et al., "A New Charge Pump Without Degradation in Threshold Voltage Due to Body Effect," IEEE Journal of Solid-State Circuits, Aug. 2000, pp. 1227-1230, vol., 35, No. 8, available from IEEE; http://www.ieee.org/ieeexplore.

* cited by examiner

*Primary Examiner*—Quan Tra
(74) *Attorney, Agent, or Firm*—Arthur J. Behiel; LeRoy D. Maunu; Justin Liu

(57) ABSTRACT

Described is a power multiplexer that alternately transmits zero, supply voltage, and a relatively high voltage to a common output node. The power multiplexer includes low-impedance voltage switches, at least one of which includes a well-voltage select circuit. The well-voltage select circuit adjusts the well bias on a power-switching transistor, and consequently protects the power-switching transistor from damage caused by gate breakdown and forwarding biasing of the well.

7 Claims, 5 Drawing Sheets

POWER MULTIPLEXER AND SWITCH WITH ADJUSTABLE WELL BIAS FOR GATE BREAKDOWN AND WELL PROTECTION

BACKGROUND

Certain circuits require a plurality of voltage levels on a given conductor at various times for their operation. By way of example, there exists a type of integrated circuit known as Programmable Logic Devices (PLD's), which typically make use of one or more programmable interconnect arrays to configure themselves to a specific user's design. The programmable interconnect arrays are typically composed of nonvolatile, floating-gate memory cells (e.g., EPROM, EEPROM, flash EPROM, and the like).

Circuit features, including those of memory cells, grow ever smaller with improvements in integrated-circuit process technology. The reduction in feature size improves device performance while at the same time reducing cost and power consumption. Unfortunately, smaller feature sizes also increase a circuit's vulnerability to over-voltage conditions. Among the more sensitive elements in a modern integrated circuit are the gate oxide layers of the various MOS transistors. These layers are very thin in modern devices, and are consequently easily ruptured by excessive voltage levels. Modern circuits with small feature sizes therefore employ significantly lower source voltages than was common only a few years ago. For example, modern 0.18-micron processes employ supply voltages as low as 1.8 volts.

Floating-gate memory cells are erased using a physical effect known as "Fowler-Nordheim tunneling." Such cells are programmed using either Fowler-Nordheim tunneling or another physical effect known as "hot-electron injection." In either case, the required program and erase voltages are dictated by physical properties of the materials used to fabricate memory cells. Unfortunately, these physical properties have not allowed the voltages required to program, erase, and verify the program state of a memory cell to be reduced in proportion to reductions in supply voltages. For example, modern flash memory cells adapted for use with 0.18-micron processes require program and erase voltages as high as 14 volts, a level far exceeding the required supply voltage. Such memory cells are verified using a range of voltages from about zero volts to about 4.5 volts, the upper end of which is also potentially damaging to sensitive circuits.

The high voltages necessary to program, erase, and verify a memory cell can be provided from external sources or generated on chip. (As the term is used herein, "high-voltage" refers to voltage levels above the normal supply voltage VDD of the device.) On-chip generators typically include charge pumps that pump the supply voltage VDD to one or more desired high-voltage levels. The various voltages are then routed to the required destination circuits using one or more high-voltage power multiplexers.

Unfortunately, conventional on-chip voltage generators are very limited in terms of the power they can supply. First, the programming voltages are already on the upper end of what can be tolerated by modern semiconductor devices, making it difficult to increase power by stepping up the high-voltage levels. Second, increased output current generally comes at the expense of increased chip size. It is therefore desirable to maximize the output power of on-chip voltage generators without unduly increasing their size and power consumption.

FIG. 1 (prior art) depicts a conventional power multiplexer 100 that alternatively provides a high-voltage HV (e.g., 12 volts), a supply voltage VDD (e.g., 1.8 volts), or ground potential GND (e.g., zero volts) on an output terminal $V_{OUT}$. High voltage HV is conventionally provided by a charge pump 105 controlled by a terminal enable-high-voltage pump EN_HVPMP, but can optionally be supplied from an off-chip source.

Multiplexer 100 includes a high-voltage switch 110, a VDD switch 115, a ground switch 120, and some select logic 125. In response to a pair of select terminals S1 and S2, select logic 125 closes one of switches 110, 115, and 120 as follows:

1. a logic one (e.g., VDD) on enable-high-voltage line EN_HV closes high-voltage switch 110 to provide voltage HV on terminal $V_{OUT}$;
2. a logic one on enable-VDD line EN_VDD closes VDD switch 115 to provide supply voltage VDD on terminal $V_{OUT}$; and
3. a logic one on enable-ground line EN_GND closes VDD switch 115 (by forward biasing an NMOS transistor 130) to provide supply voltage GND on terminal $V_{OUT}$.

Only one of enable signals EN_HV, EN_VDD, and EN_GND are logic one at any time. In general, both signals (e.g., signal EN_HV) and the corresponding physical node (e.g., lines or terminals) are referred to herein by the same name: whether a given reference pertains to a signal or a corresponding node will be clear from the context.

Multiplexers similar to multiplexer 100 are described in U.S. Pat. No. 5,650,672 entitled "High-Voltage Power Multiplexer" and U.S. Pat. No. 5,661,685 entitled "Programmable Logic Device with Configurable Power Supply," both of which are incorporated herein by reference.

FIG. 2 (prior art) details an example of high-voltage switch 110 of FIG. 1, which includes a level shifter 200 having an output terminal connected to the gate of a high-voltage PMOS transistor 210. Level shifter 200 conventionally converts the zero-to-VDD logic signal on high-voltage enable line EN_HV into a zero-to-HV output signal on the gate of transistor 210. Setting high-voltage enable line EN_HV to a logic one makes transistor 210 conductive, which consequently provides high voltage HV on output terminal $V_{OUT}$.

FIG. 3 (prior art) details a switch 115A, an example of switch 115 of FIG. 1, that includes a level shifter 300 having an output terminal connected to the gate of an NMOS transistor 310. Level shifter 300 conventionally converts the zero-to-VDD logic signal on enable line EN_VDD into a $V_T$-to-V output signal on the gate of transistor 310, where V equals VDD plus the threshold voltage $V_T$ of NMOS transistor 310. The additional voltage $V_T$ compensates for the voltage drop from the gate of transistor 310 to output terminal $V_{OUT}$ so that switch 115A provides VDD on output terminal $V_{OUT}$.

The trouble with switch 115A is two-fold. First, voltage V is above VDD, and is therefore generated using a charge pump or derived from charge-pump-generated voltage HV. As noted above, it is preferred to minimize the use of charge pumps. Second, transistor 310 is never entirely off because when enable line EN_VDD is zero, the gate voltage on transistor 310 is $V_T$ rather than zero. Thus biased, transistor 310 may shunt current from high-voltage line HV to output line $V_{OUT}$. This current shunting wastes power and undesirably clamps high-voltage line HV to a voltage level below HV.

FIG. 4 (prior art) details a switch 115B, another example of switch 115, that addresses some of the shortcomings of switch 115A of FIG. 3. Switch 115B includes a pair of level shifters 400 and 405 having output terminals HLVLS connected to the gates of a pair of high-voltage PMOS transistors 410 and 415. An inverter 420 inverts VDD enable signal EN_VDD and provides the result to the control terminals CTRL of level shifters 400 and 405.

Level shifter 400 conventionally converts the zero-to-VDD logic signal from an inverter 420 into a zero-to-VDD output signal on the gate of transistor 410. Level shifter 405 converts the same zero-to-VDD logic signal from inverter 420 into an output signal on the gate of transistor 415 that ranges from zero volts to whatever the voltage level on output terminal $V_{OUT}$. (Recall that the voltage on output terminal $V_{OUT}$ can be high-voltage HV or ground potential when VDD is de-selected).

Switch 115B overcomes both problems discussed above in connection with switch 115A. First, transistors 410 and 415 are PMOS transistors, so there is no $V_T$ drop between VDD and output terminal VOUT; second, when enable-VDD line EN_VDD is zero volts, transistors 410 and 415 are entirely off so there is no shunting of current from terminal VDD to line $V_{OUT}$. Also, the configuration of transistors 410 and 415 ensures that each respective well is connected to the highest voltage applied to each transistor, which eliminates forward biasing of the PMOS transistor well. Unfortunately, these advantages are not without cost: the series resistance of the two transistors 410 and 415 limits the drive strength of switch 400.

SUMMARY

The present invention is directed to a power multiplexer that provides improved drive strength without requiring additional charge-pump resources. The power multiplexer includes low-impedance voltage switches, at least one of which includes a well-voltage select circuit. The well-voltage select circuit adjusts the well bias on a power-switching transistor to adjust for changes in the multiplexer output voltage, and consequently protects the power-switching transistor from damage caused by gate breakdown and forward biasing of the well.

This summary does not limit the invention, which is instead defined by the claims.

BRIEF DESCRIPTION OF THE FIGURES

FIG. 6 depicts a power multiplexer 600 similar to power multiplexer 100 of FIG. 1, like-named elements being the same or similar.

DETAILED DESCRIPTION

Figure 1:
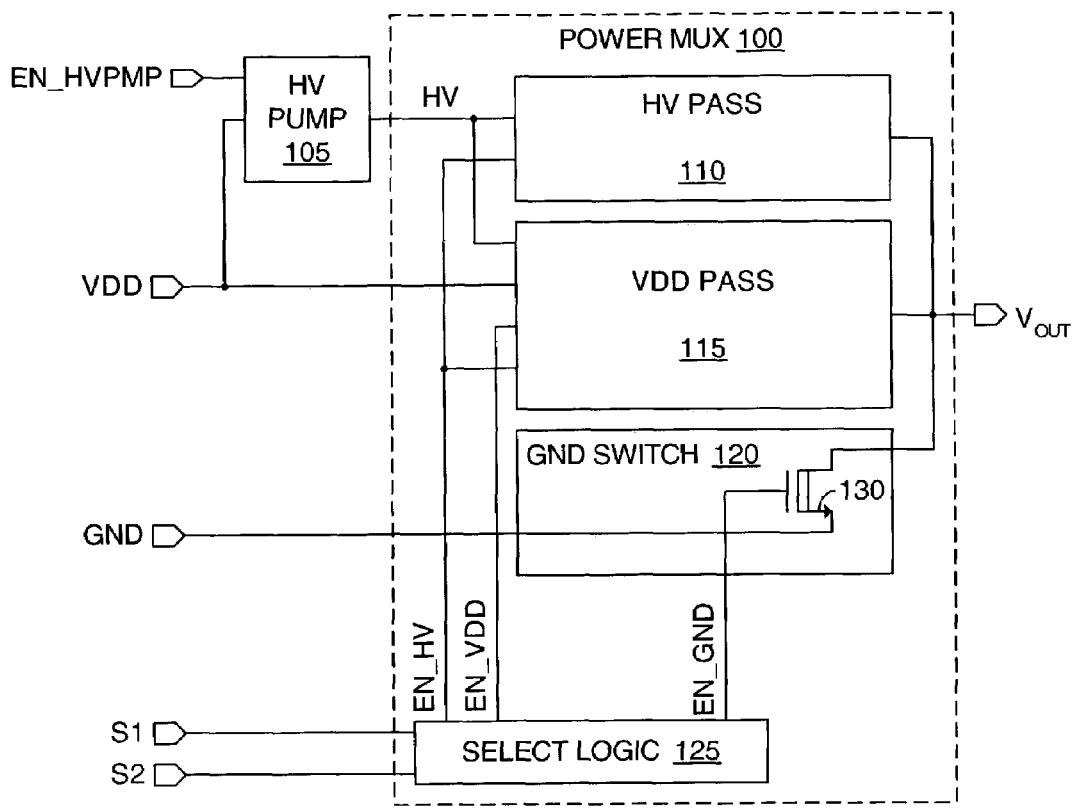
FIG. 1 (prior art) depicts a conventional power multiplexer 100.
Figure 2:
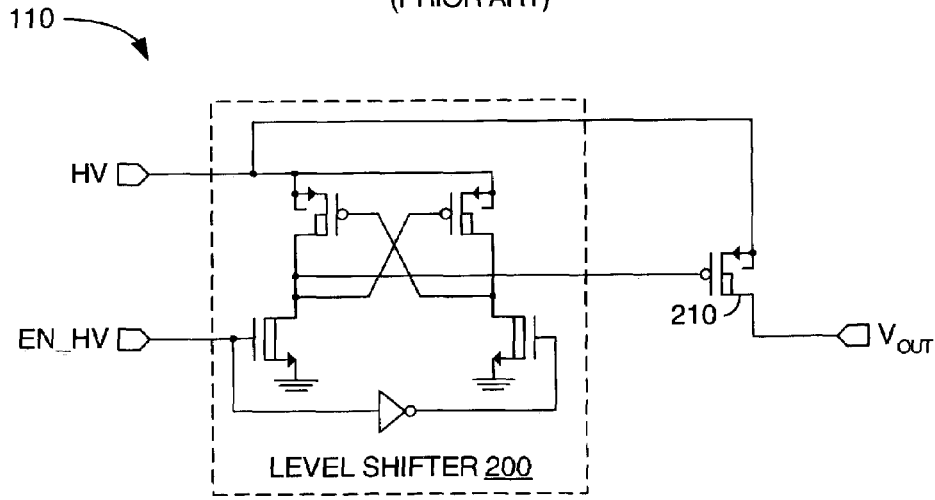
FIG. 2 (prior art) details an example of high-voltage switch 110 of FIG. 1.
Figure 3:
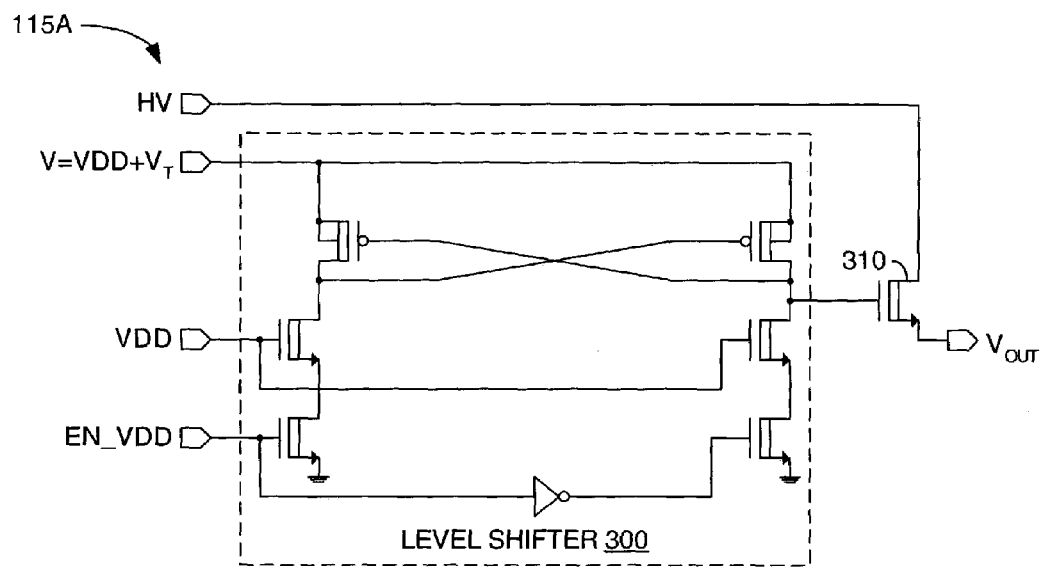
FIG. 3 (prior art) details a switch 115A, an example of switch 115 of FIG. 1.
Figure 4:
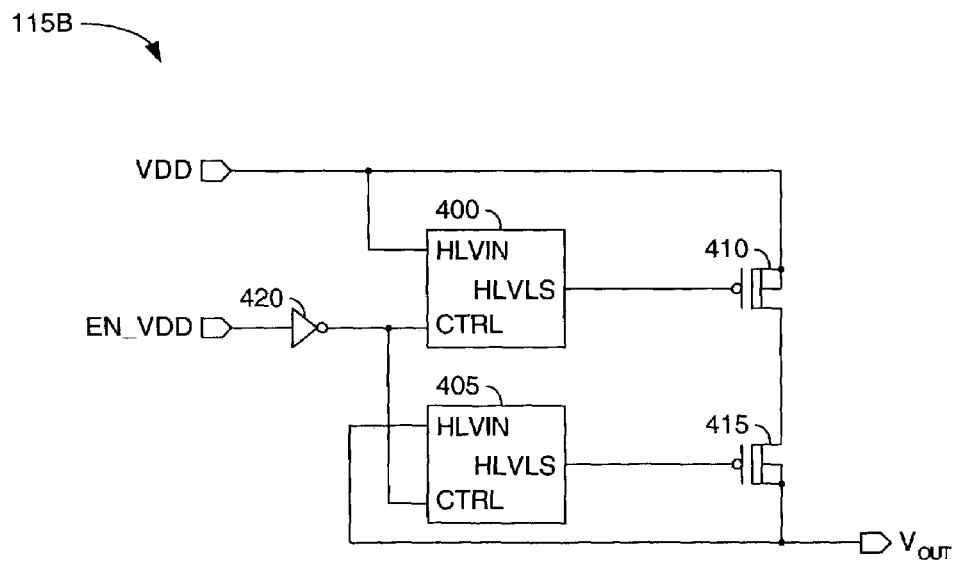
FIG. 4 (prior art) details a switch 115B, another example of switch 115 of FIG. 1.
Figure 5:
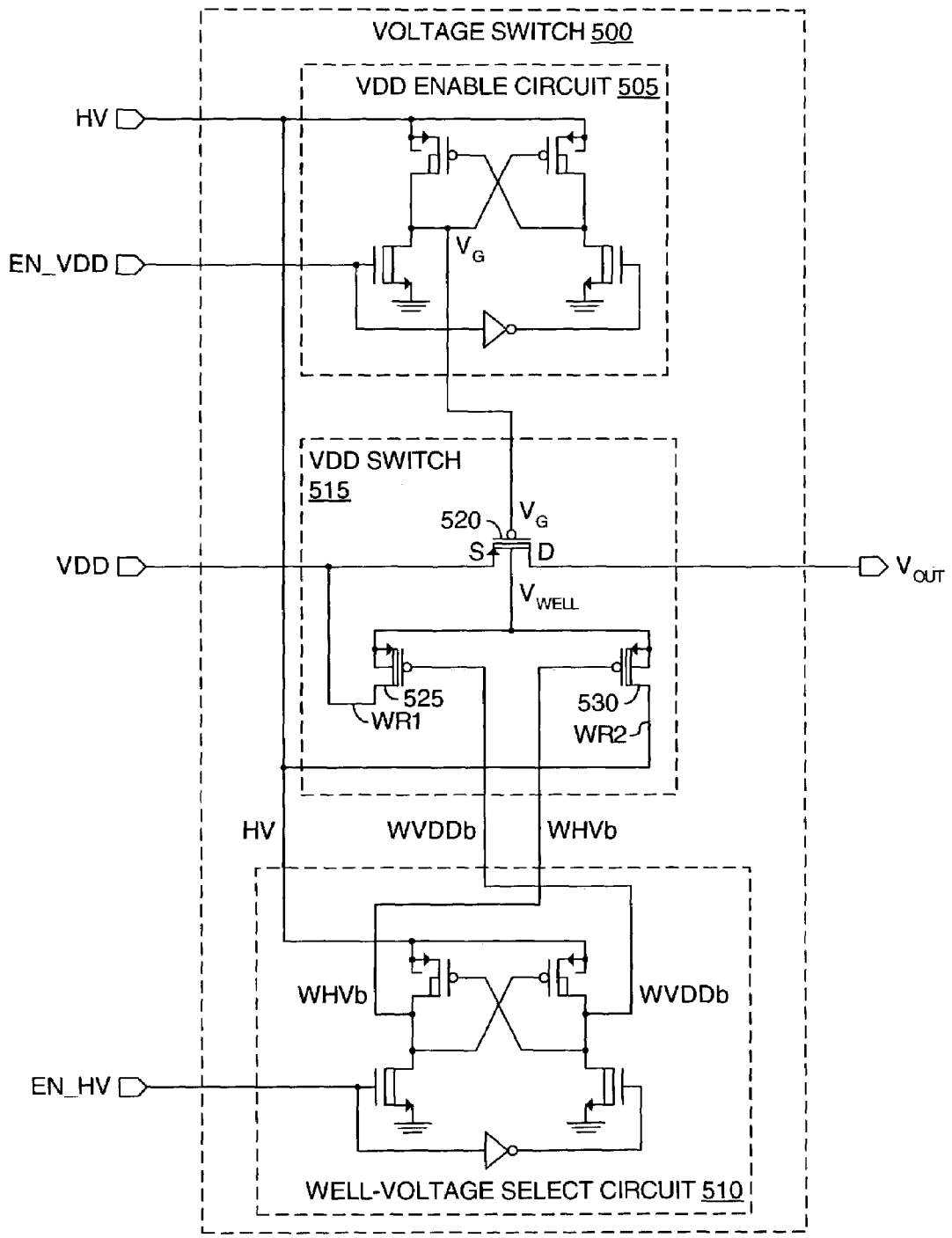
FIG. 5 depicts a voltage switch 500 in accordance with one embodiment of the invention.

FIG. 5 depicts a voltage switch 500 in accordance with one embodiment of the invention. Voltage switch 500, used in place of voltage switch 115 of FIG. 1, provides improved drive strength without requiring additional charge-pump resources.

Voltage switch 500 includes a VDD-enable circuit 505, a well-voltage select circuit 510, and a VDD switch 515. Voltage switch 500 selectively opens and closes VDD switch 515 in response to control signals EN_VDD and EN_HV. When closed, VDD switch 515 passes VDD to terminal $V_{OUT}$.

Enable circuit 505, a conventional level shifter, converts the zero-to-VDD logic signal on enable line EN_VDD into a zero-to-HV output signal $V_G$. Well-voltage select circuit 510, also a level shifter, converts the zero-to-VDD logic signal on enable line EN_HV into a pair of complementary zero-to-HV output signals WHVb and WVDDb (the "b" in each signal name indicates an active-low signal).

The switching element of switch 515 is a high-voltage PMOS transistor 520. The gate (control terminal) of transistor 520 connects to VDD-enable circuit 505 at terminal $V_G$, while the two current-handling terminals (source S and drain D) connect to VDD and output terminal $V_{OUT}$, respectively. The output of circuit 505 thus determines whether transistor 520 conducts, and consequently whether switch 515 is open or closed.

Transistor 520 is a four-terminal device. The well terminal is an active input connected alternatively to a first well-reference voltage WR1 or a second well-reference voltage WR2 via a pair of transistors 525 and 530. In the example, the first and second well-reference voltages are VDD and HV, respectively. In the depicted embodiment, transistor 525 pulls the well terminal of transistor 520 to VDD when terminal $V_{OUT}$ is at a voltage potential less than or equal to VDD, and transistor 530 pulls the well terminal of transistor 520 to high-voltage HV when terminal $V_{OUT}$ is at a voltage potential greater than VDD. Adjusting the well voltage of transistor 520 for changes in output voltage $V_{OUT}$ prevents the well of transistor 520 from being forward biased with respect to the source or drain, and consequently protects transistor 520 from damage due to gate breakdown.

Figure 6:
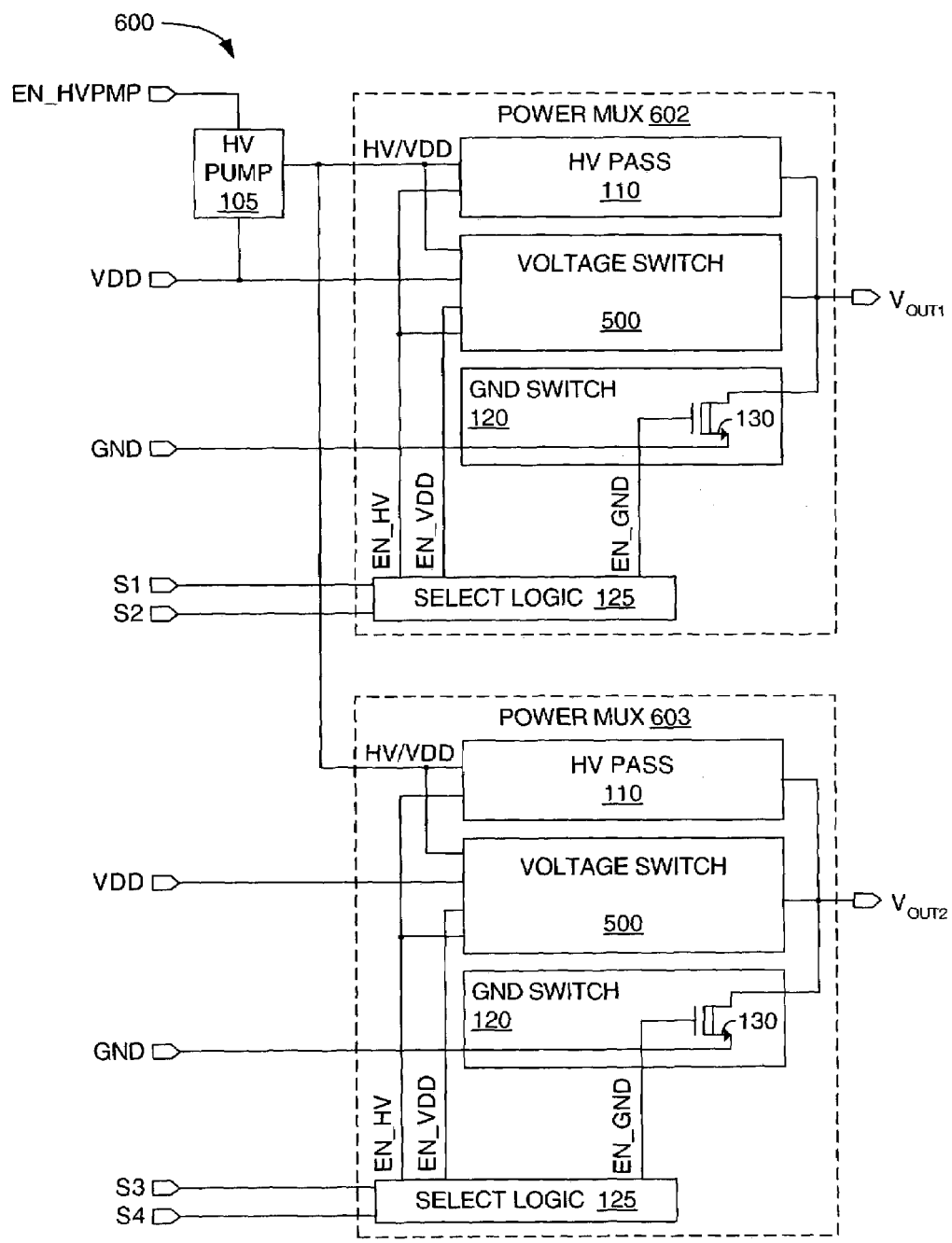

FIG. 6 depicts a system 600 that includes a pair of power multiplexers 602 and 603, each of which is similar to power multiplexer 100 of FIG. 1, like-named elements being the same or similar. As with multiplexer 100, multiplexers 602 and 603 alternatively provide a high-voltage HV (e.g., 12 volts), a supply voltage VDD (e.g., 1.8 volts), or ground potential GND (e.g., zero volts) on respective output terminals $V_{OUT1}$, and $V_{OUT2}$. In multiplexers 602 and 603, however, voltage switch 500 (FIG. 5) replaces voltage switch 115 of FIG. 1. In a flash memory circuit, output terminals $V_{OUT1}$, and $V_{OUT2}$ connect to collections of EEPROM cells (not shown) at different logical addresses.

Figure 7:
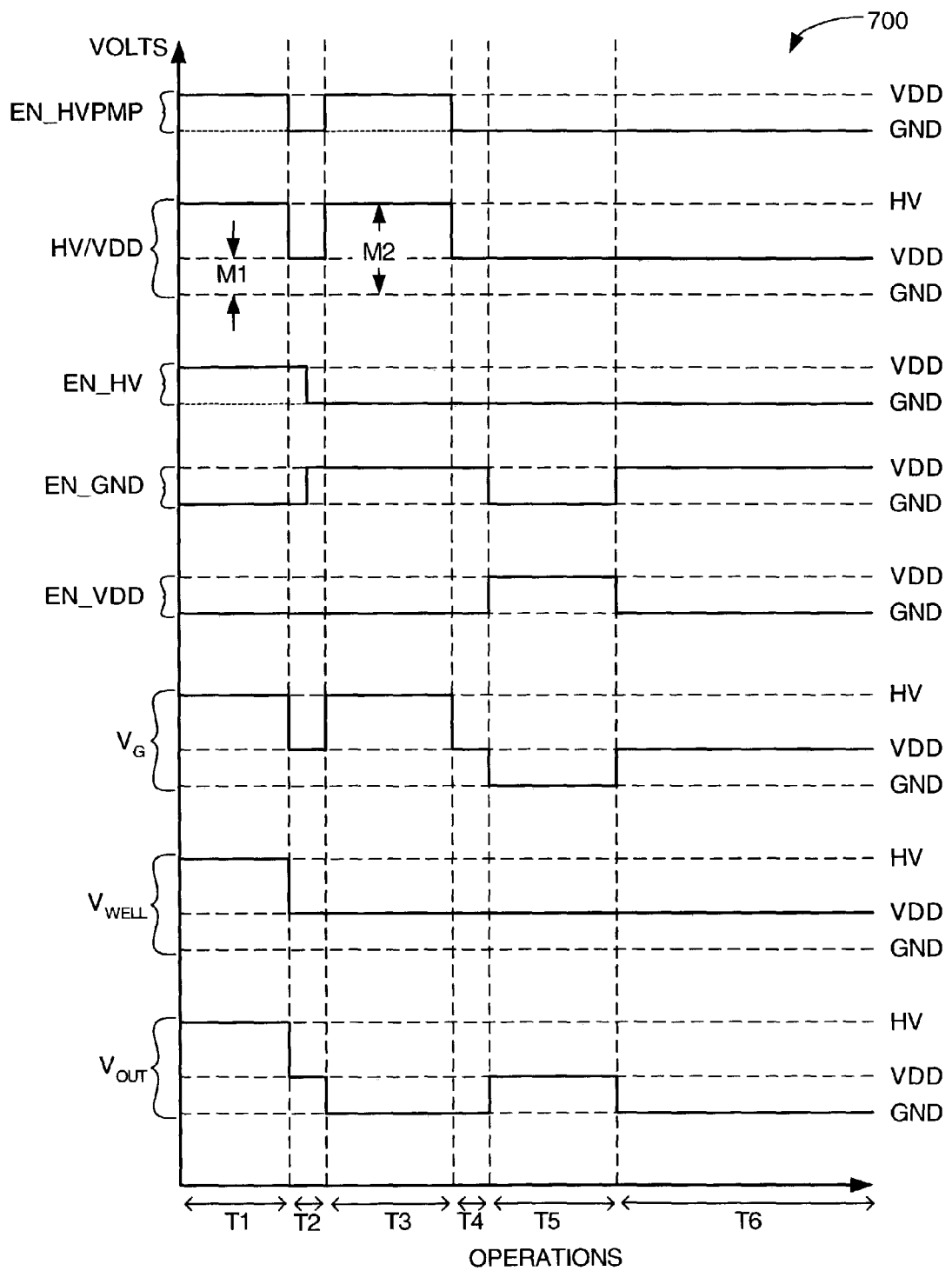
FIG. 7 is a waveform diagram 700 illustrating the operation of multiplexer 600 of FIG. 6 in one embodiment.

FIG. 7 is a waveform diagram 700 illustrating the operation of multiplexer 600 of FIG. 6 in one embodiment. The discussion of multiplexer 600 focuses on the operation of voltage switch 500 of FIG. 5 because the remaining components of multiplexer 600 are as described in the foregoing background section.

Diagram 700 depicts the voltage levels of various signals corresponding to the like-named nodes, lines, and terminals of multiplexer 600 (FIG. 6) and VDD switch 515 (FIG. 5) during various operations of multiplexer 600. The left vertical axis of diagram 700 lists the signal names; the right side of diagram 700 identifies the voltage levels possible for each signal; and the horizontal axis identifies six operations T1–T6 of multiplexer 600. The operations include pass high-voltage T1, high-voltage transition T2, high-voltage inhibit T3, high-to-low voltage transition T4, pass VDD T5, and benign T6.

When one of multiplexers 602 and 603 is in high-voltage operation T1, signal line EN_HVPMP is asserted high to turn on charge pump 105 (FIG. 6), driving signal line HV/VDD to high voltage HV. High-voltage-enable signal EN_HV is also asserted for the selected multiplexer (assume multiplexer 602), causing high-voltage switch 110 to pass high-voltage level HV to signal line $V_{OUT1}$. Also during operation T1, switch 500 sets the gate voltage $V_G$ and well-voltage $V_{WELL}$ of transistor 520 to high-voltage HV. Thus biasing transistor 520 holds voltage switch 500 open and reverse biases the well of transistor 520.

High-voltage terminal HV/VDD is reduced to VDD before any of control signals EN_HV, EN_GND, or EN_VDD change state. Reducing the voltage on terminal HV/VDD before changing states facilitates switching of the level shifters in multiplexer 600. Moreover, EEPROM cells can be damaged if program and erase voltages are applied too quickly. The output of high-voltage pump 105 is therefore reduced to VDD before switching high-voltage HV between output terminals $V_{OUT1}$, and $V_{OUT2}$. In FIG. 7, this voltage reduction takes place during high-voltage transition operation T2. Reducing signal line HV/VDD to VDD during operation T2 also brings signal lines $V_G$ and $V_{WELL}$ to VDD. Thus biased, switch 500 remains open.

Enable-ground signal line EN_GND is asserted in high-voltage-inhibit operation T3, bringing $V_{OUT}$ to ground potential (zero volts). Like high-voltage operation T1, signal lines HV/VDD and $V_G$ are held at high voltage HV, keeping switch 500 open, but well-biasing signal $V_{WELL}$ is held at the supply voltage level VDD. This biasing protects transistor 520 from gate breakdown. Operation T3 is employed, for example, by multiplexer 602 when multiplexer 603 is providing high-voltage HV on respective output terminal $V_{OUT2}$ (i.e., when multiplexer 603 is performing operation T1).

High-to-low voltage transition operation T4 de-asserts signal EN_HVPMP to switch off charge pump 105 and asserts control signal EN_GND to ground output terminal $V_{OUT}$. VDD switch 515 (FIG. 5) remains open, with signals $V_G$ and $V_{WELL}$ transitioning to supply voltage VDD. Operation T4 occurs each time one of multiplexers 602 and 603 transitions from a high-voltage operation (operations T1 and T3) to a relatively low-voltage operation (operations T5 or T6).

Pass-VDD operation T5 asserts control signal EN_VDD and de-asserts control signals EN_HV and EN_GND. As a consequence, signal line $V_G$ is reduced to zero volts, closing switch 500 to provide supply voltage VDD on output terminal $V_{OUT}$.

Finally, asserting control signal EN_GND when terminal EN_HVPMP is de-asserted brings multiplexer 600 into benign operation T6, in which signal lines $V_G$ and $V_{WELL}$ are at supply voltage VDD, and switch 500 is consequently open. All power multiplexers (multiplexers 602 and 603 in this simple example) enter operation T6, a low-power state, when the program, erase, and verify circuits are not in use.

The following discussion employs voltage switch 500, power mux 602, and diagram 700 (of FIGS. 5, 6, and 7, respectively) to describe the operation of voltage switch 500. When enable signals EN_HVPMP and EN_HV are high (and signals EN_GND and EN_VDD low), output signal $V_{OUT}$ is at high-voltage HV (corresponding to operation T1). VDD enable circuit 505 provides high-voltage HV on gate terminal $V_G$ of transistor 520, keeping switch 515 open. At the same time, well-voltage select circuit 510 produces respective low and high voltage signals on terminals WHVb (for "well-high-voltage") and WVDDb (for "well-VDD"), and consequently turns transistor 525 off and transistor 530 on. The well terminal $V_{WELL}$ of transistor 520 is therefore connected to high-voltage HV via transistor 530. Raising the well terminal of transistor 520 to the same voltage level as the gate and drain prevents the well of transistor 520 from becoming forward biased.

Moving now to the example of FIG. 7, during the pass VDD operation T5 in which control signal EN_VDD is high and the remaining control signals low, VDD enable circuit 505 produces a logic zero on gate terminal $V_G$ of transistor 520, thereby closing switch 515. Enable signal EN_HVPMP is de-asserted at this time, so signal line HV/VDD is at the supply voltage level VDD. Control signal EN_HV is also de-asserted, so well-voltage select circuit 510 turns on transistor 525 and turns off transistor 530 to connect well terminal $V_{WELL}$ to VDD.

Returning again to FIG. 7 and referencing the case in which control signal EN_GND is high and control signals EN_HV and EN_VDD low (operations T3, T4, and T6), VDD enable circuit 505 provides high-voltage HV on gate terminal $V_G$ of transistor 520, thereby opening switch 515. Enable signal EN_HV is also a logic zero at this time, so well-voltage select circuit 510 turns on transistor 525 and turns off transistor 530. The well terminal $V_{WELL}$ of transistor 520 is therefore connected to VDD via transistor 525.

The foregoing examples depict multiplexers that select from between three possible voltages. The invention may be applied, however, to systems that require different numbers of output voltages. In the general case, multiplexers in accordance with embodiments of the invention select from between two or more voltages of differing magnitudes with respect to a reference. In the example of FIG. 7, one of the switched voltages, VDD, is depicted as having a first magnitude M1 with respect to ground (the reference), and a second of the switched voltages, HV, is depicted as having a second magnitude M2 with respect to ground. In other embodiments, one or both switched voltages may differ, and additional switched voltages might also be included.

While the present invention has been described in connection with specific embodiments, variations of these embodiments will be obvious to those of ordinary skill in the art. For example, the charge pump output, provided on signal line HV/VDD, may not be directly connected to multiplexer 600 but instead might be provided by an intermediate circuit. The output of the intermediate circuit might require auxiliary logic circuit to adapt it to function with multiplexer 600. Also, high-voltage inhibit operation T3 might not be required at all which can result in a simpler control logic than the one depicted. Moreover, some components are shown directly connected to one another while others are shown connected via intermediate components. In each instance the method of interconnection establishes some desired electrical communication between two or more circuit nodes, or terminals. Such communication may often be accomplished using a number of circuit configurations, as will be understood by those of skill in the art. Therefore, the spirit and scope of the appended claims should not be limited to the foregoing description.

What is claimed is:

1. A multiplexer adapted to provide a selected one of a first voltage level or a second voltage level on a multiplexer output terminal, wherein the first voltage level is of a first magnitude with respect to a reference and the second voltage level is of a second magnitude with respect to the reference, and wherein the first magnitude is greater than the second magnitude, the multiplexer comprising:

a first voltage switch having:
- a first voltage-switch input terminal receiving the first voltage level; and
- a first voltage-switch output terminal connected to the multiplexer output terminal, wherein the first voltage switch is selectively activated to provide the first voltage level to the multiplexer output terminal;

a second voltage switch selectively activated to provide the second voltage level to the multiplexer output terminal, the second voltage switch including:
- a first transistor having:
  - a first current-handling terminal receiving the second voltage level;
  - a second current-handling terminal connected to the multiplexer output terminal;
  - a first control terminal; and
  - a well terminal;
- a second transistor having a third current-handling terminal, a second control terminal, and a fourth current-handling terminal connected to the well terminal of the first transistor;
- an enable circuit having an enable circuit terminal connected to the first control terminal to selectively activate the second voltage switch;
- a well-voltage select circuit having a voltage-select terminal connected to the second control terminal;
- a first well-reference terminal connected to the third current-handling terminal;
- a third transistor having a fifth current-handling terminal connected to the well terminal, a third control terminal, and a sixth current-handling terminal; and
- a second well-reference terminal connected to the sixth current-handling terminal;
- wherein the first well-reference terminal connects to the first voltage level in response to deactivating the second voltage switch and the second well-reference terminal connects to the second voltage level in response to deactivating the first voltage switch;

wherein the well-voltage select circuit comprises a level shifter having a level shifter output terminal connected to the second control terminal.

2. The multiplexer of claim 1, wherein the second transistor connects the well terminal to the first voltage level when the first voltage switch connects the first voltage-switch input terminal to the multiplexer output terminal, and wherein the second transistor disconnects the well terminal from the first voltage level when the first voltage switch disconnects the first voltage-switch input terminal from the multiplexer output terminal.

3. The multiplexer of claim 1, further comprising a third voltage switch having:
- a third voltage-switch input terminal receiving a third input voltage level; and
- a third voltage-switch output terminal connected to the multiplexer output terminal.

4. The multiplexer of claim 1, wherein the enable circuit comprises a level shifter having a level-shifter output terminal connected to the first control terminal.

5. A method of multiplexing first and second voltage levels, provided on respective first and second input terminals, onto a multiplexer output terminal, the method comprising:

connecting the first input terminal to the multiplexer output terminal via a four-terminal transistor, the four-terminal transistor having a first current-handling terminal connected to the first input terminal, a second current-handling terminal connected to the multiplexer output terminal, a control terminal, and a well terminal;

conveying the first voltage level from the first input terminal to the multiplexer output terminal while applying a first well-reference voltage to the well terminal;

conveying the second voltage level from the second input terminal to the multiplexer output terminal while applying a second well-reference voltage to the well terminal and to the control terminal;

conveying a third voltage level from a third input terminal to the multiplexer output terminal; and applying the first voltage level to the well while conveying the third voltage level from the third input terminal to the multiplexer output terminal;

wherein the first well-reference voltage is the first voltage level; and wherein the second well-reference voltage is the second voltage level.

6. The method of claim 5, wherein the first voltage level is VDD and the second voltage level is a high-voltage above VDD.

7. The method of claim 5, further comprising applying the second voltage level to the control terminal while conveying the second voltage level from the second input terminal to the multiplexer output terminal.

\* \* \* \* \*